United States Patent
Noguchi et al.

(10) Patent No.: US 8,624,244 B2
(45) Date of Patent: Jan. 7, 2014

(54) THIN FILM TRANSISTOR INCLUDING A LIGHT-TRANSMITTING SEMICONDUCTOR FILM AND ACTIVE MATRIX SUBSTRATE

(75) Inventors: Reiko Noguchi, Kumamoto (JP); Kazunori Inoue, Kumamoto (JP); Masaru Aoki, Kumamoto (JP); Toshihiko Iwasaka, Kumamoto (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/346,193

(22) Filed: Jan. 9, 2012

(65) Prior Publication Data
US 2012/0187393 A1  Jul. 26, 2012

(30) Foreign Application Priority Data
Jan. 21, 2011 (JP) ................. 2011-010440

(51) Int. Cl.
*H01L 29/04* (2006.01)
*H01L 29/10* (2006.01)
*H01L 31/036* (2006.01)
*H01L 31/0376* (2006.01)
*H01L 31/20* (2006.01)
*H01L 29/12* (2006.01)
*H01L 29/76* (2006.01)
*H01L 31/112* (2006.01)
*H01L 29/15* (2006.01)

(52) U.S. Cl.
USPC ............. 257/57; 257/43; 257/66; 257/72; 257/E29.117; 257/E29.151; 257/E29.273

(58) Field of Classification Search
USPC ......... 257/57, 56, 66, 72, E29.117, E29.151, 257/E29.273, 43
See application file for complete search history.

(56) References Cited

U.S. PATENT DOCUMENTS

| 5,334,860 | A  | * | 8/1994 | Naito ................. 257/59 |
| 7,129,556 | B2 | * | 10/2006 | Kwon ............... 257/443 |
| 7,408,190 | B2 | * | 8/2008 | Tsao et al. ........... 257/57 |
| 7,655,947 | B2 | * | 2/2010 | Ando et al. .......... 257/52 |

(Continued)

FOREIGN PATENT DOCUMENTS

| JP | 2005-77822 | 3/2005 |
| JP | 2007-73702 | 3/2007 |

(Continued)

OTHER PUBLICATIONS

Kenji Nomura, et al., "Room-temperature fabrication of transparent flexible thin-film transistors using amorphous oxide semiconductors", Nature, vol. 432, Nov. 25, 2004, p. 488.

*Primary Examiner* — Ida M Soward
(74) *Attorney, Agent, or Firm* — Oblon, Spivak, McClelland, Maier & Neustadt, L.L.P.

(57) ABSTRACT

A thin film transistor includes a gate electrode, a semiconductor layer, and a source electrode and a drain electrode placed on the semiconductor layer and electrically connected with the semiconductor layer. The semiconductor layer includes a light-transmitting semiconductor film and an ohmic conductive film placed on the light-transmitting semiconductor film and having a lower light transmittance than the light-transmitting semiconductor film. The ohmic conductive film is formed not to protrude from the light-transmitting semiconductor film. The ohmic conductive film is formed in separate parts with a channel part between the source electrode and the drain electrode interposed therebetween. The source electrode and the drain electrode are connected to the light-transmitting semiconductor film through the ohmic conductive film.

13 Claims, 10 Drawing Sheets

(56) References Cited

U.S. PATENT DOCUMENTS

| | | | |
|---|---|---|---|
| 7,847,289 B2 * | 12/2010 | Kim et al. | 257/59 |
| 7,915,689 B2 * | 3/2011 | Cho et al. | 257/390 |
| 7,919,795 B2 * | 4/2011 | Lee et al. | 257/288 |
| 7,960,729 B2 * | 6/2011 | Chen | 257/57 |
| 8,164,701 B2 * | 4/2012 | Koike et al. | 349/43 |
| 8,242,502 B2 * | 8/2012 | Hu et al. | 257/57 |
| 8,263,978 B2 * | 9/2012 | Yoo et al. | 257/59 |
| 8,378,348 B2 * | 2/2013 | Saito et al. | 257/59 |
| 2007/0069209 A1 * | 3/2007 | Jeong et al. | 257/57 |
| 2007/0090365 A1 | 4/2007 | Hayashi et al. | |
| 2007/0241327 A1 | 10/2007 | Kim et al. | |
| 2008/0217602 A1 * | 9/2008 | Kahen | 257/13 |
| 2009/0230395 A1 * | 9/2009 | Lee et al. | 257/59 |
| 2010/0025678 A1 | 2/2010 | Yamazaki et al. | |
| 2010/0051942 A1 * | 3/2010 | Ryu et al. | 257/43 |
| 2011/0147756 A1 * | 6/2011 | Moriguchi et al. | 257/60 |
| 2011/0169005 A1 * | 7/2011 | Saito et al. | 257/59 |
| 2012/0193633 A1 * | 8/2012 | Kohno et al. | 257/66 |

FOREIGN PATENT DOCUMENTS

| | | |
|---|---|---|
| JP | 2007-115902 | 5/2007 |
| JP | 2007-284342 | 11/2007 |
| JP | 2008-72011 | 3/2008 |
| JP | 2010-56539 | 3/2010 |
| JP | 2011-49544 | 3/2011 |
| WO | WO 2011/013682 A1 | 2/2011 |

* cited by examiner

THIN FILM TRANSISTOR INCLUDING A LIGHT-TRANSMITTING SEMICONDUCTOR FILM AND ACTIVE MATRIX SUBSTRATE

INCORPORATION BY REFERENCE

This application is based upon and claims the benefit of priority from Japanese patent application No. 2011-010440, filed on Jan. 21, 2011, the disclosure of which is incorporated herein in its entirety by reference.

BACKGROUND OF THE INVENTION

1. Field of the Invention

The present invention relates to a thin film transistor, an active matrix substrate, and a manufacturing method thereof.

2. Description of Related Art

A TFT active matrix substrate (which is hereinafter referred to simply as "TFT substrate") using a thin film transistor (hereinafter referred to as "TFT") as a switching element is an example of semiconductor devices. The TFT substrate is used for an electro-optical device such as a display device. The semiconductor device such as TFT has features of low power consumption and low profile. Taking advantage of such features of the semiconductor device, its application to a flat panel display as an alternative to a cathode ray tube (CRT) is increasing.

There is a demand for cost reduction for the semiconductor device. For this reason, a back-channel TFT is widely used for a switching element of a TFT substrate for liquid crystal displays. In the back-channel TFT for liquid crystal displays, amorphous silicon (Si) is typically used as a semiconductor active layer, and an inverted staggered structure is adopted.

Further, development of a TFT using an oxide semiconductor for an active layer has been growing active recently (cf. Japanese Unexamined Patent Application Publications Nos. 2007-284342 and 2007-73702). The oxide semiconductor has a higher mobility than amorphous silicon used hitherto. As the oxide semiconductor, zinc oxide (ZnO) or IGZO containing gallium oxide ($Ga_2O_3$) and indium oxide ($In_2O_3$) in addition to zinc oxide (ZnO) is mainly used. This technique is disclosed also in Japanese Unexamined Patent Application Publication No. 2005-77822, Nature Vol. 432(2004) p. 488, and Japanese Unexamined Patent Application Publication No. 2007-115902, for example. An oxide semiconductor film has a high translucency. For example, the technique of applying an oxide semiconductor film having a transmittance of 70% or higher for visible light of 400 nm to 800 nm is disclosed in Japanese Unexamined Patent Application Publication No. 2007-115902.

The above-described oxide semiconductor film is insoluble in an alkaline developer for photoresist, just like an oxide conductive film such as ITO (indium oxide ($In_2O_3$)+tin oxide ($SnO_2$)) and IZO (indium oxide ($In_2O_3$)+zinc oxide (ZnO)), which are known as a transparent conductive film. In addition, the oxide semiconductor film can be etched using a weak acid solution such as oxalic acid or carboxylic acid. Thus, the oxide semiconductor film has an advantage that patterning is easy.

On the other hand, the oxide semiconductor film easily solves in an acid solution which is commonly used when etching a general metal film (Cr, Ti, Mo, Ta, Al and an alloy of them) used for a source electrode and a drain electrode of a TFT. Therefore, when manufacturing a TFT using an oxide semiconductor for an active layer, the technique disclosed in Japanese Unexamined Patent Application Publication No. 2008-72011, for example, is used. According to the technique, the type of a metal film, an etching solution of a metal film, and an oxide semiconductor film is appropriately selected for manufacture. This enables selective etching by which only the metal film for the source electrode and the drain electrode is etched and the oxide semiconductor film remains unetched.

To manufacture a TFT substrate, a metal film and a semiconductor film are sequentially formed. Then, after a photoresist pattern is formed in a photolithography process, etching is performed. A wiring, electrode and semiconductor pattern is thereby formed. In this way, a TFT substrate is manufactured.

When there is an anomaly in the pattern of wiring, electrode or semiconductor, a failure occurs in a performance test after the process is completed, resulting in a decrease in yield. To avoid this, inspection of the final shape of the pattern is performed as appropriate after each process of manufacture in some cases. Namely, it is important for cost reduction to detect a pattern failure in the early stage before completion of products.

The detection of a pattern failure is typically performed by observing the pattern using an optical microscope and inspecting the pattern shape. The inspection of the pattern shape may be performed by automatically reading image data and comparing it with normal shape data or by direct visual examination.

However, in the case of inspecting the pattern shape using the image through the optical microscope, the following problem occurs. Specifically, the inspection of a material with high transmittance like the oxide semiconductor film is difficult compared to a material that reflects light like the metal film, causing a decrease in detection sensitivity. This leads to a decrease in productivity.

Further, as described above, in the case of using a known typical oxide semiconductor film, selective etching with a known typical metal film as a wiring and electrode material using a chemical solution is difficult. Accordingly, the variety of combinations of a metal film, a semiconductor film and an etching chemical solution is limited. This raises an issue that the range of choice of materials in improvement of TFT characteristics or the like is significantly restricted.

The present invention has been accomplished in view of the above circumstances, and it is desirable to provide a thin film transistor allowing a broad range of choice of materials and having high productivity, an active matrix substrate, and a manufacturing method thereof.

SUMMARY OF THE INVENTION

A first exemplary aspect of the present invention is a thin film transistor including a gate electrode, a semiconductor layer disposed opposite to the gate electrode with a gate insulating film interposed therebetween, a source electrode placed above the semiconductor layer and electrically connected with the semiconductor layer, and a drain electrode placed above the semiconductor layer and electrically connected with the semiconductor layer, wherein the semiconductor layer includes a light-transmitting semiconductor film light-transmitting semiconductor film and a conductive film placed on the light-transmitting semiconductor film light-transmitting semiconductor film and having a lower light transmittance than the light-transmitting semiconductor film light-transmitting semiconductor film, the conductive film is formed not to protrude from the light-transmitting semiconductor film light-transmitting semiconductor film, the conductive film is formed in separate parts with a channel part between the source electrode and the drain electrode interposed therebetween, and the source electrode and the drain electrode are connected to the light-transmitting semiconductor film light-transmitting semiconductor film through the conductive film.

A second exemplary aspect of the present invention is a manufacturing method of a thin film transistor including steps of forming a gate electrode above a substrate, forming a gate insulating film above the gate electrode, depositing a light-transmitting semiconductor film light-transmitting semiconductor film and a conductive film having a lower light transmittance than the light-transmitting semiconductor film light-transmitting semiconductor film in lamination above the gate insulating film, forming a semiconductor layer by patterning the light-transmitting semiconductor film light-transmitting semiconductor film and the conductive film into an island shape, forming a source electrode and a drain electrode disposed opposite to each other with a space therebetween above the conductive film, and forming a channel part by removing the conductive film interposed between the source electrode and the drain electrode, wherein the conductive film is made of aluminum or an alloy film predominantly composed of aluminum, and the step of forming the semiconductor layer etches the conductive film using a solution containing tetramethylammonium hydroxide.

A third exemplary aspect of the present invention is a manufacturing method of a thin film transistor including steps of forming a gate electrode above a substrate, forming a gate insulating film above the gate electrode, depositing a light-transmitting semiconductor film light-transmitting semiconductor film and a conductive film having a lower light transmittance than the light-transmitting semiconductor film light-transmitting semiconductor film in lamination above the gate insulating film, forming a semiconductor layer by patterning the light-transmitting semiconductor film light-transmitting semiconductor film and the conductive film into an island shape, forming a source electrode and a drain electrode disposed opposite to each other with a space therebetween above the conductive film, and forming a channel part by removing the conductive film interposed between the source electrode and the drain electrode, wherein the conductive film is made of copper or an alloy film predominantly composed of copper, and the step of forming the semiconductor layer etches the conductive film using a solution containing ammonium persulfate.

According to the present invention, it is possible to provide a TFT allowing a broad range of choice of materials and having high productivity, an active matrix substrate, and a manufacturing method thereof.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

First Exemplary Embodiment

Figure 1:
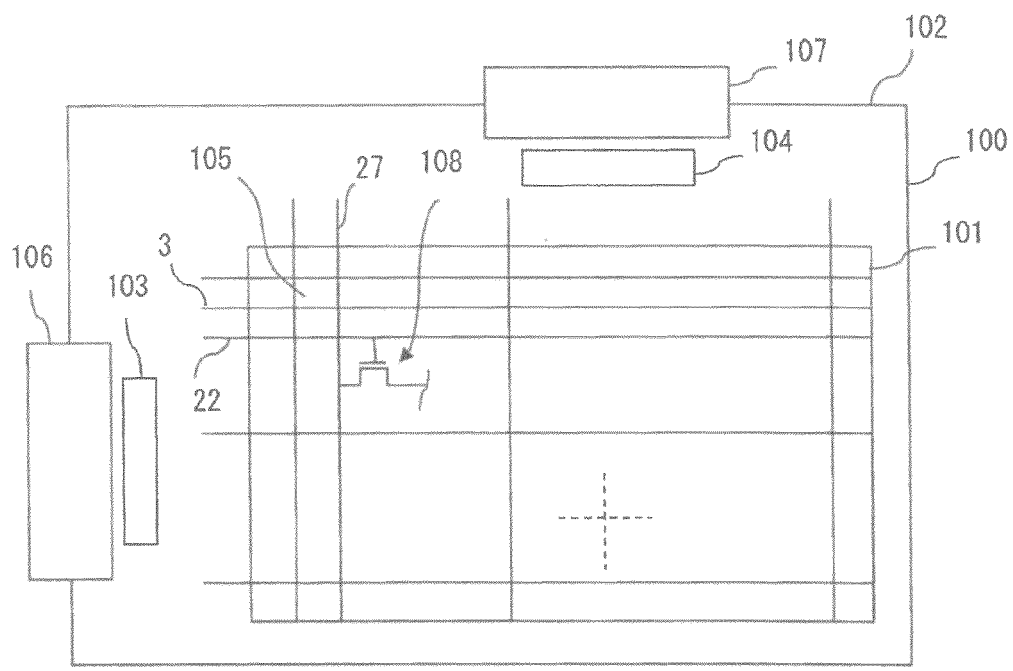
FIG. 1 is a plan view showing a structure of a TFT substrate according to an exemplary embodiment.

A TFT substrate according to an exemplary embodiment is an active matrix substrate using a thin film transistor (TFT) as a switching element. The TFT substrate is used for a flat panel display such as a liquid crystal display (LCD). First, the TFT substrate is described with reference to FIG. 1. FIG. 1 is a plan view showing the structure of the TFT substrate. Detailed description is provided below by taking the TFT substrate for the LCD as an example.

A TFT substrate 100 is a TFT array substrate in which TFTs 108 are arranged in a matrix, for example. On the TFT substrate 100, a display area 101 and a frame area 102 surrounding the display area 101 are laid out. In the display area 101, a plurality of gate lines (scan signal lines) 22, a plurality of auxiliary capacitor electrodes 3, and a plurality of source lines (display signal lines) 27 are placed.

The plurality of gate lines 22 are laid out in parallel. The plurality of source lines 27 are also laid out in parallel. In FIG. 1, the gate lines 22 are placed horizontally, and the source lines 27 are placed vertically. The gate lines 22 and the source lines 27 are arranged to intersect with each other. Further, the gate lines 22 and the source lines 27 are orthogonal to each other. A region surrounded by the adjacent gate lines 22 and the adjacent source lines 27 is a pixel 105. In the TFT substrate 100, the pixels 105 are arranged in matrix.

The plurality of auxiliary capacitor electrodes 3 are placed in parallel with the plurality of gate lines 22. The auxiliary capacitor electrodes 3 are respectively placed between the adjacent gate lines 22. Thus, the gate lines 22 and the auxiliary capacitor electrodes 3 are arranged alternately with each other. The auxiliary capacitor electrodes 3 and the source lines 27 are arranged to intersect with each other. Further, the auxiliary capacitor electrodes 3 and the source lines 27 are orthogonal to each other.

Further, a scan signal driver 103 and a display signal driver 104 are placed in the frame area 102 of the TFT substrate 100. The gate lines 22 extend from the display area 101 to the frame area 102. The gate lines 22 are connected to the scan signal driver 103 at the end of the TFT substrate 100. The source lines 27 also extend from the display area 101 to the frame area 102. The source lines 27 are connected to the display signal driver 104 at the end of the TFT substrate 100. An external wiring 106 is connected in close proximity to the scan signal driver 103. Further, an external wiring 107 is connected in close proximity to the display signal driver 104. The external wirings 106 and 107 are wiring boards such as a flexible printed circuit (FPC), for example.

Various kinds of external signals are supplied to the scan signal driver 103 and the display signal driver 104 through the external wirings 106 and 107. The scan signal driver 103 supplies a gate signal (scan signal) to the gate lines 22 according to an external control signal. In response to the gate signal, the gate lines 22 are sequentially selected. The display signal driver 104 supplies a display signal to the source lines 27 according to an external control signal or display data. A display voltage corresponding to the display data can be thereby supplied to the respective pixels 105. Note that the scan signal driver 103 and the display signal driver 104 are not necessarily placed on the TFT substrate 100. For example, the drivers may be connected by tape carrier package (TCP). Further, the auxiliary capacitor electrodes 3 overlap a pixel electrode, which is described later, and form an auxiliary capacitor together with the pixel electrode. For example, a common voltage is supplied to the auxiliary capacitor electrodes 3 from the scan signal driver 103, the display signal driver 104 or the like.

In the pixel 105, at least one TFT 108 is placed. The TFT 108 is placed in close proximity to an intersection between the source line 27 and the gate line 22. The TFT 108 serves as a switching element for supplying a display voltage to the pixel electrode, for example. A gate electrode of the TFT 108 is connected to the gate line 22, and ON and OFF of the TFT 108 are controlled according to a gate signal that is input through the gate terminal. A source electrode of the TFT 108 is connected to the source line 27. When a voltage is applied to the gate electrode and the TFT 108 is turned ON, a current flows from the source line 27. A display voltage is thereby applied to the pixel electrode that is connected to a drain electrode of the TFT 108. Then, an electric field corresponding to the display voltage is generated between the pixel electrode and a counter electrode. Note that an alignment film (not shown) may be placed on the surface of the TFT substrate 100. The TFT substrate 100 has the above-described structure.

Further, in the case of the liquid crystal display, a counter substrate is disposed opposite to the TFT substrate 100. The counter substrate is a color filter substrate, for example, and placed on the viewing side. In the counter substrate, a color filter, a black matrix (BM), a counter electrode, an alignment film and the like are placed. In the case of an IPS liquid crystal display, for example, the counter electrode is placed on the TFT substrate 100 side. The TFT substrate 100 and the counter substrate are attached with a certain space (cell gap) therebetween. Liquid crystals are injected and sealed in the gap. In other words, a liquid crystal layer is placed between the TFT substrate 100 and the counter substrate. Further, a polarizing plate, a phase difference plate and so on are placed on the respective outer sides of the TFT substrate 100 and the counter substrate. Furthermore, a backlight unit or the like is placed on the non-viewing side of the liquid crystal display panel having the above structure. Because the TFT substrate 100 is placed on the non-viewing side and the counter substrate is placed on the viewing side, the backlight unit is placed on the outer side of the TFT substrate 100.

The liquid crystals are driven by the electric field between the pixel electrode and the counter electrode. Specifically, the orientation of the liquid crystals between the substrates varies. The polarization state of light passing through the liquid crystal layer is thereby changed. Specifically, the polarization state of light that has been linearly polarized through the polarizing plate is changed by the liquid crystal layer. To be more precise, light from the backlight unit is linearly polarized by the polarizing plate on the TFT substrate 100 side. The linearly polarized light then passes through the liquid crystal layer, thereby changing its polarization state.

Accordingly, the amount of light passing through the polarizing plate on the counter substrate side varies depending on the polarization state. Specifically, the amount of light passing through the polarizing plate on the viewing side, among transmitted light that is transmitted through the liquid crystal display panel from the backlight unit, varies. The orientation of the liquid crystals varies by the applied display voltage. Thus, the amount of light passing through the polarizing plate on the viewing side can be changed by controlling the display voltage. Specifically, a desired image can be displayed by changing the display voltage with respect to each pixel.

Figure 2:
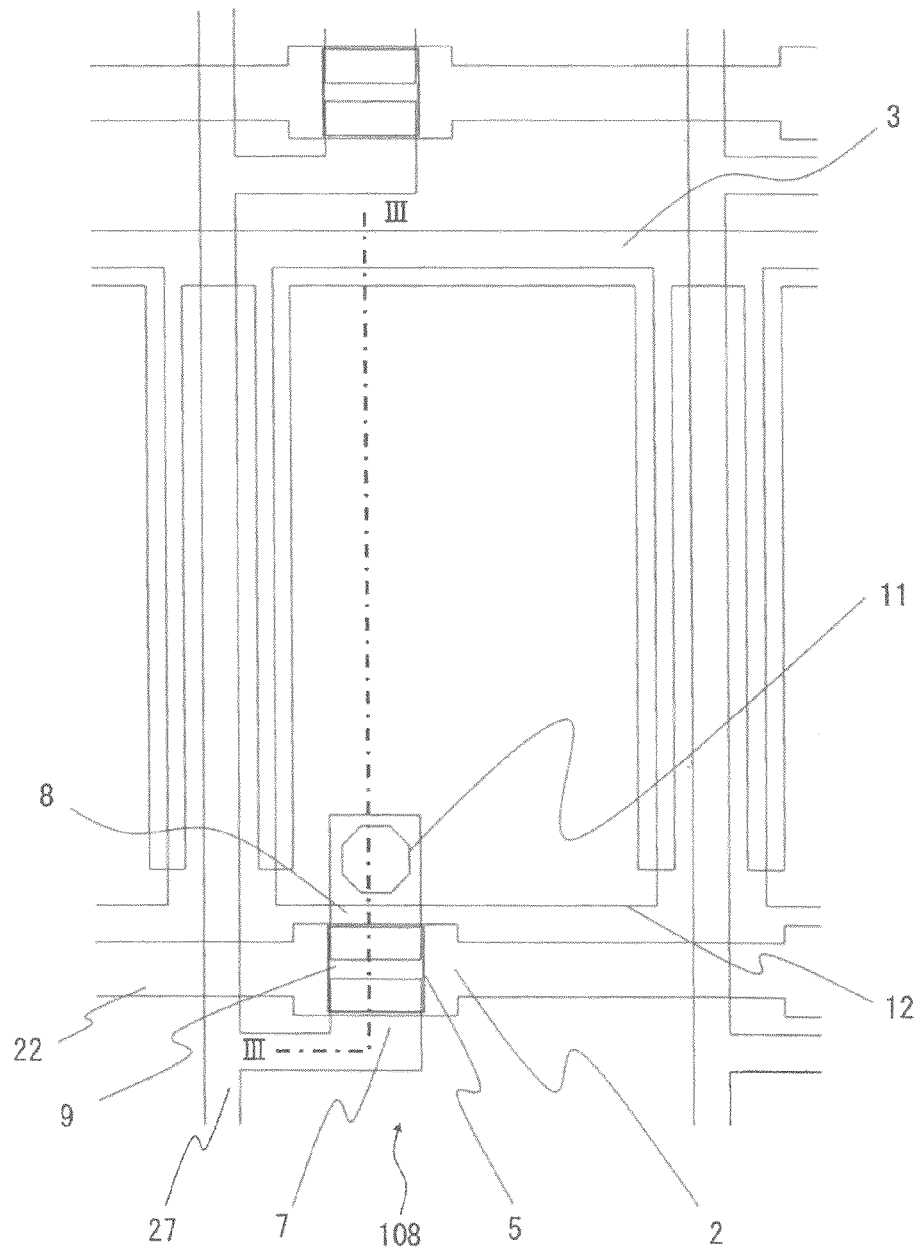
FIG. 2 is a plan view showing a pixel structure of a TFT substrate according to an exemplary embodiment.

The structure of the pixel 105 of the TFT substrate 100 is described hereinafter with reference to FIGS. 2 and 3. FIG. 2 is a plan view schematically showing a pixel structure, and FIG. 3 is a cross-sectional view along line in FIG. 2.

Figure 3:
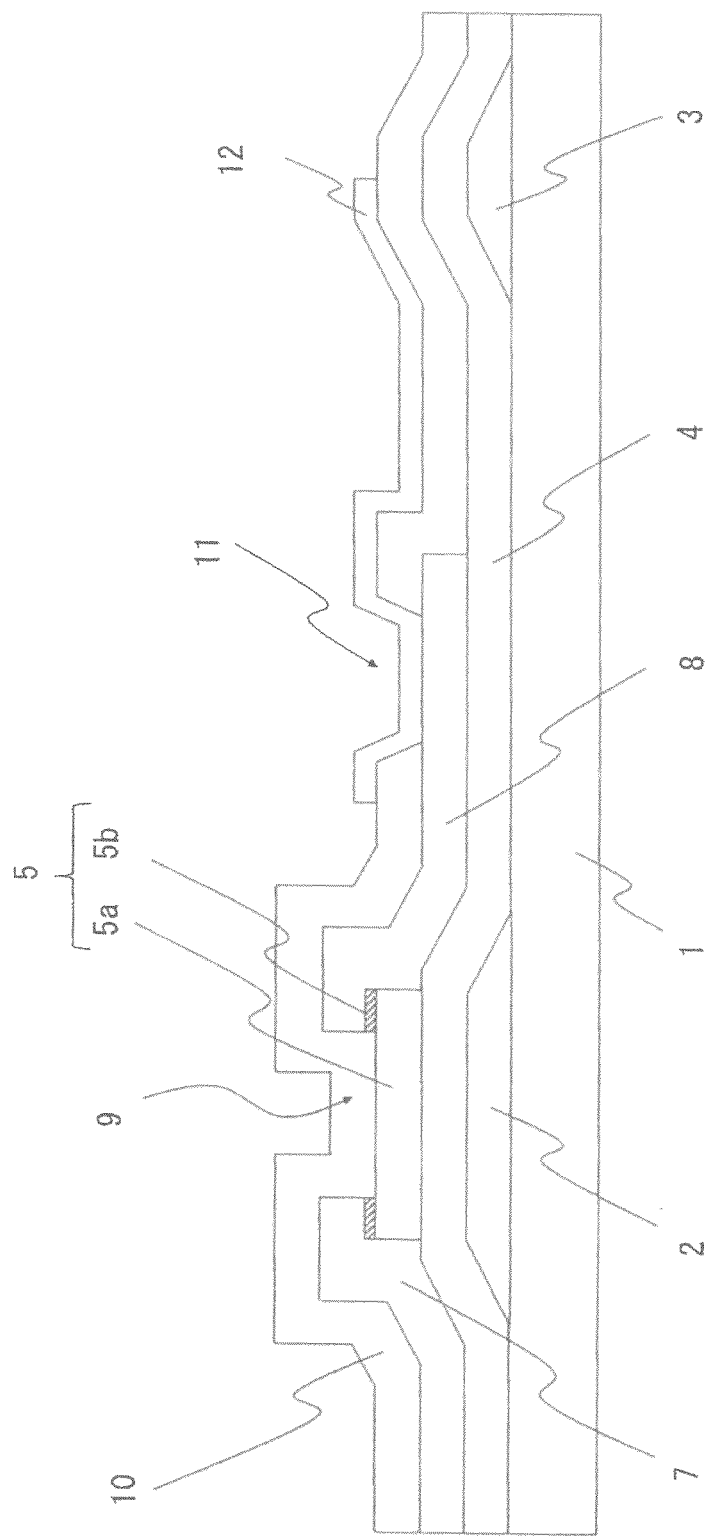
FIG. 3 is a cross-sectional view of a TFT substrate according to an exemplary embodiment.

Referring to FIGS. 2 and 3, on a substrate 1 are a gate electrode 2, a gate insulating film 4, a semiconductor layer 5, a source electrode 7, a drain electrode 8, a channel part 9, a protective insulating film 10, a contact hole 11, and a pixel electrode 12.

The substrate 1 is a transparent insulating substrate such as glass, for example. On the substrate 1, the gate lines 22 and the auxiliary capacitor electrodes 3 are placed. In FIG. 2, the gate lines 22 are laid out horizontally. The gate line 22 has the gate electrode 2 of the TFT 108. Specifically, the gate line 22 at the TFT 108 serves as the gate electrode 2. The gate electrode 2 is wider than the gate line 22. The auxiliary capacitor electrodes 3 are arranged side by side with the gate lines 22. Further, an extension part which extends from the auxiliary capacitor electrode 3 is placed in close proximity to the source line 27. The extension part of the auxiliary capacitor electrodes 3 is in parallel with the source line 27. The gate insulating film 4 is placed on the auxiliary capacitor electrodes 3 and the gate lines 22. The gate insulating film 4 covers the auxiliary capacitor electrodes 3, the gate lines 22 and the gate electrode 2.

The semiconductor layer 5 is placed on the gate insulating film 4. In the TFT, the semiconductor layer 5 is formed in an island shape. The semiconductor layer 5 has a two-layer structure of a light-transmitting semiconductor film light-transmitting semiconductor film 5a and an ohmic conductive film 5b. The term "light-transmitting" material means that the material is translucent and/or transparent. The light-transmitting semiconductor film light-transmitting semiconductor film 5a is a non-silicone light-transmitting semiconductor film light-transmitting semiconductor film, for example. Use of the light-transmitting semiconductor film light-transmitting semiconductor film 5a as an active layer enables achievement of a higher mobility than amorphous silicon. Specifically, zinc oxide (ZnO) or IGZO containing gallium oxide ($Ga_2O_3$) and indium oxide ($In_2O_3$) in addition to zinc oxide (ZnO) may be used as the light-transmitting semiconductor film light-transmitting semiconductor film 5a. The ohmic conductive film 5b has a lower light transmittance than the light-transmitting semiconductor film light-transmitting semiconductor film 5a. As the ohmic conductive film 5b, a light reflection film such as aluminum (Al) or Al alloy may be used. For example, the light-transmitting semiconductor film light-transmitting semiconductor film 5a has a transmittance of 50% or more for 550 nm, the center wavelength of visible light, and the ohmic conductive film 5b with a lower transmittance than the light-transmitting semiconductor film light-transmitting semiconductor film 5a has a transmittance of less than 50% for the wavelength 550 nm.

The semiconductor layer 5 is disposed above the gate electrode 2. Thus, the semiconductor layer 5 is disposed opposite to the gate electrode 2 with the gate insulating film 4 interposed therebetween. The ohmic conductive film 5b is formed on a part of the light-transmitting semiconductor film light-transmitting semiconductor film 5a. In other words, the ohmic conductive film 5b does not protrude from the light-transmitting semiconductor film light-transmitting semiconductor film 5a when viewed from above. Further, the ohmic conductive film 5b is not formed in the channel part 9. The channel part 9 serves as a back channel region in which the ohmic conductive film 5b is removed. The ohmic conductive film 5b is in the form of separate parts with the channel part 9 placed therebetween.

The source electrode 7 and the drain electrode 8 are placed on the semiconductor layer 5. The source electrode 7 and the drain electrode 8 are spaced from each other. Further, the source electrode 7 and the drain electrode 8 are arranged opposite to each other with the channel part 9 placed therebetween. The source electrode 7 and the drain electrode 8 are formed to protrude from the semiconductor layer 5. The source electrode 7 extends from the source line 27. In FIG. 2, the source lines 27 are placed vertically, and the source electrode 7 extends rightward from the source line 27. In the TFT 108, the source electrode 7 extends to above the gate electrode 2. The ohmic conductive film 5b is placed immediately below the source electrode 7 and the drain electrode 8. Specifically, the ohmic conductive film 5b is disposed between the source electrode 7, the drain electrode 8 and the light-transmitting semiconductor film light-transmitting semiconductor film 5a, so that the source electrode 7 and the drain electrode 8 do not contact with the light-transmitting semiconductor film light-transmitting semiconductor film 5a. In this manner, the source electrode 7 and the drain electrode 8 are connected to the light-transmitting semiconductor film light-transmitting semiconductor film 5a through the ohmic conductive film 5b.

The protective insulating film 10 is placed on the semiconductor layer 5, the source electrode 7 and the drain electrode 8. The protective insulating film 10 is formed all over the substrate to cover the drain electrode 8, the source electrode 7 and the like. Further, the protective insulating film 10 protects the channel part 9.

The pixel electrode 12 is placed on the protective insulating film 10. The pixel electrode 12 is disposed above the drain electrode 8 and lines over the edge of the drain electrode 8. Further, the contact hole 11 is made in the protective insulating film 10. The contact hole 11 reaches a part of the drain electrode 8 which protrudes from the semiconductor layer 5. Thus, the pixel electrode 12 is electrically connected to the drain electrode 8 through the contact hole 11. The pixel electrode 12 is formed to cover substantially the whole of a rectangular region surrounded by the source lines 27 and the gate lines 22. The pixel electrode 12 overlaps a part of the auxiliary capacitor electrodes 3. An auxiliary capacitor is thereby formed. The pixel electrode 12 is formed using a light-transmitting conductive film.

As described above, in the TFT 108 according to the exemplary embodiment, the channel part 9 exists on the semiconductor layer 5 in a region between the drain electrode 8 and the source electrode 7. In the channel part 9, the source electrode 7 and drain electrode 8 are separated. In other words, a region between the source electrode 7 and drain electrode 8 is the channel part 9. Further, in the channel part 9, the ohmic conductive film 5b is removed. Thus, in the channel part 9, the protective insulating film 10 and the light-transmitting semiconductor film light-transmitting semiconductor film 5a are in contact with each other.

A manufacturing process of the TFT is described hereinafter with reference to FIGS. 4A to 4E. FIGS. 4A to 4E are step-by-step cross-sectional views showing a manufacturing process of the TFT 108.

(FIG. 4A)

Figure 4A:
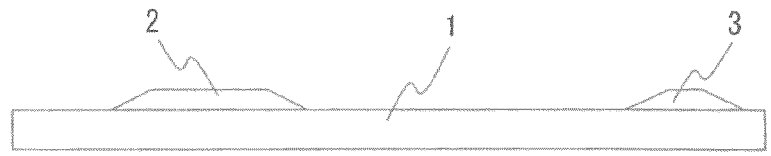
FIGS. 4A to 4E are step-by-step cross-sectional views showing a manufacturing method of a TFT substrate according to an exemplary embodiment.

First, the substrate 1 is cleaned with a cleaning fluid or pure water. Note that, in this example, a glass substrate with a thickness of 0.6 mm may be used as the substrate 1. On the cleaned substrate 1, a first metal film is deposited, and the gate electrode 2, the gate lines 22 and the auxiliary capacitor electrodes 3 are formed (FIG. 4A). As the first metal film, chromium (Cr), molybdenum (Mo), titanium (Ti), tantalum (Ta), tungsten (W), aluminum (Al), or an alloy with another trace element added to these metals may be used, for example. Further, the first metal film may have a laminated structure composed of two or more layers of those metals or alloy. By using such metals or alloy, it is possible to obtain a low-resistance film with a specific resistance of 50 μΩcm or less (FIG. 4A).

In this exemplary embodiment, an Al-3 mol % Ni alloy film with 3 mol % Ni added is used as the first metal film. The Al-3 mol % Ni alloy film is deposited with a thickness of 200 nm by sputtering using known Ar gas. After that, a photoresist pattern is formed by the first photolithography process. Etching is performed using the photoresist pattern as a mask. In this example, wet etching is performed using a known solution containing phosphoric acid, nitric acid and acetic acid. By removing the photoresist pattern after the etching, the gate electrode 2, the auxiliary capacitor electrodes 3 and the like are formed as shown in FIG. 4A.

(FIG. 4B)

Figure 4B:
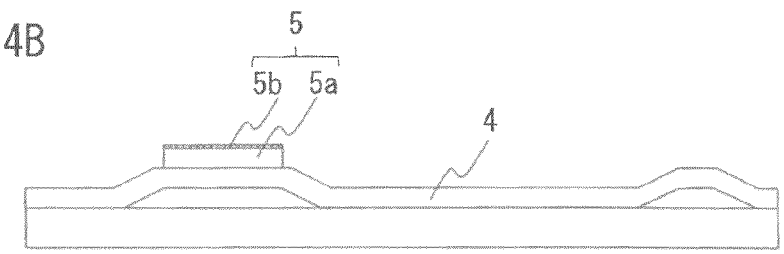

Next, the gate insulating film 4 and the semiconductor layer 5 are formed as shown in FIG. 4B. The step of FIG. 4B is described in detail with reference to FIGS. 5A to 5D. FIGS. 5A to 5D are cross-sectional views showing details of the step of FIG. 4B.

(FIG. 5A)

Figure 5A:
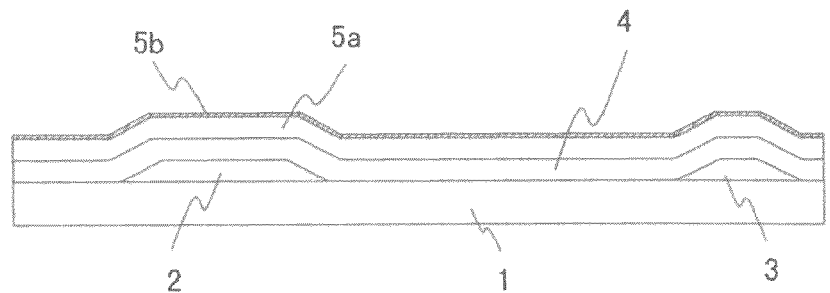
FIGS. 5A to 5D are step-by-step cross-sectional views to describe in detail a part of a manufacturing method of a TFT substrate according to an exemplary embodiment.

In this exemplary embodiment, a silicon nitride film (SiN) to serve as the gate insulating film 4 is formed using chemical vapor deposition (CVD). In this example, a silicon nitride film with a thickness of 300 nm is deposited under the substrate heating condition of about 300° C. After that, the light-transmitting semiconductor film light-transmitting semiconductor film 5a is deposited by sputtering using an oxide target having an amorphous structure (hereinafter referred to as IGZO). In this example, the IGZO target with an atomic composition ratio of In:Ga:Zn:O=1:1:1:4 is used. The oxide film is deposited by sputtering using known Ar gas (FIG. 5A).

In this case, the proportion of oxygen atom is generally lower than the stoichiometric composition, producing an oxide film in oxygen ion deficient state (in the above example, the proportion of O is less than 4). It is thereby preferred to perform sputtering using Ar gas mixed with oxygen ($O_2$) gas. In this exemplary embodiment, sputtering is performed using a mixed gas prepared by adding $O_2$ gas with a partial pressure ratio of 10% to Ar gas. The IGZO film is deposited with a thickness of 50 nm in this example.

Figure 6:
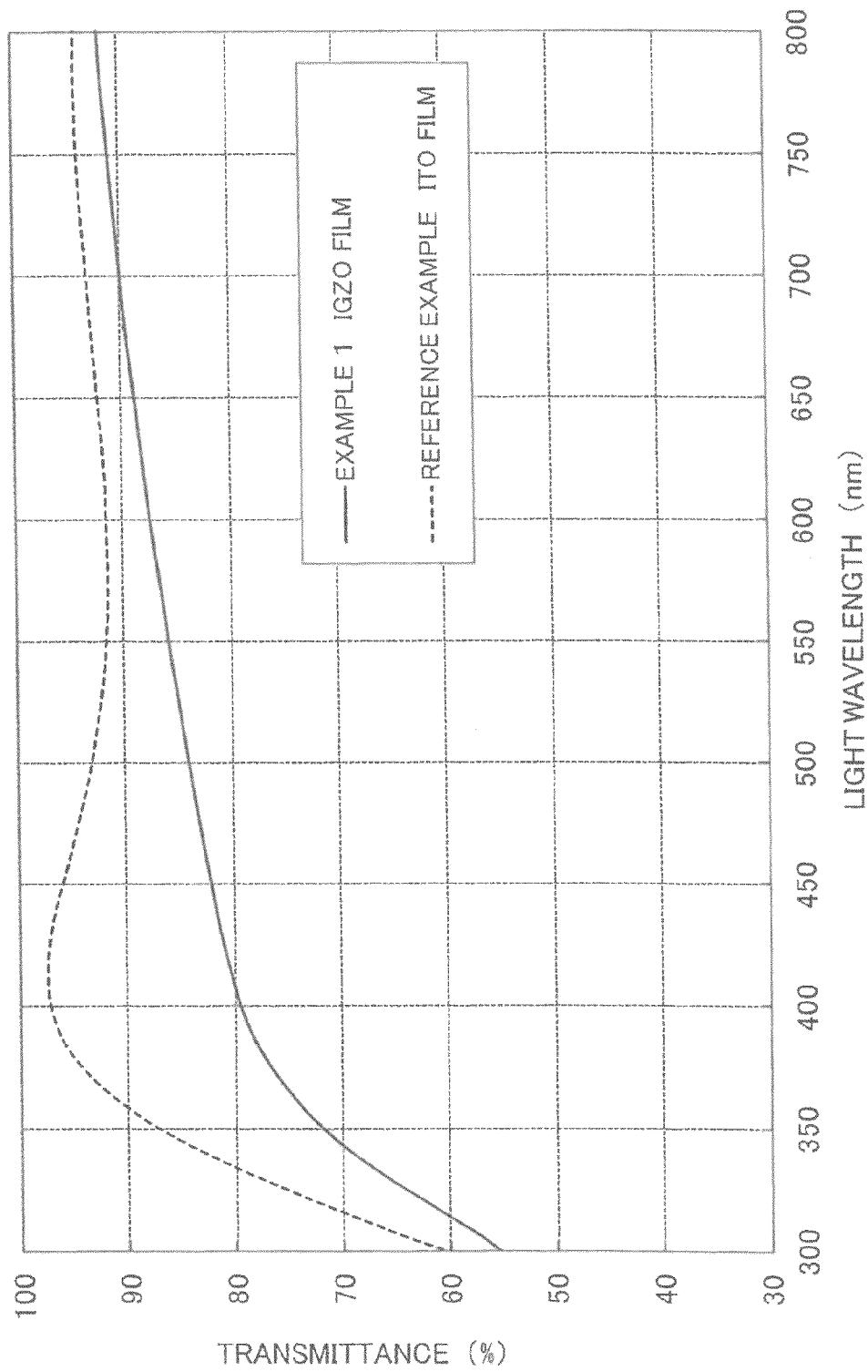
FIG. 6 is a view showing transmittance characteristics of a light-transmitting semiconductor film light-transmitting semiconductor film.

A measurement result of the transmittance of the IGZO film is shown in FIG. 6. FIG. 6 shows the transmittance of the structure using the IGZO film as an example 1. Further, a result of an ITO film known as a transparent conductive film is also shown as a reference example 1 for the purpose of comparison. In FIG. 6, the horizontal axis indicates a light wavelength, and the vertical axis indicates a transmittance. The IGZO film has a high transmittance of 85.9% for a wavelength of 550 nm, though the transmittance is lower than that of the ITO film.

Figure 5B:
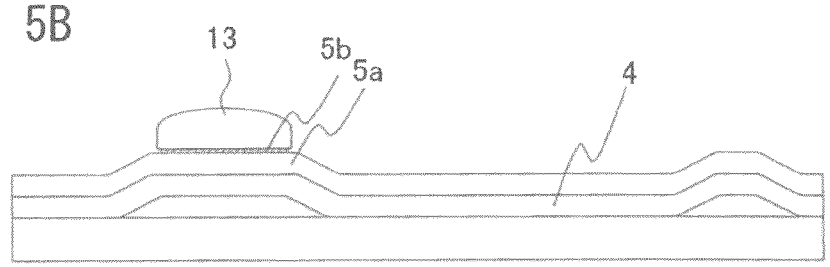

After that, an Al film is deposited as the ohmic conductive film 5b. Note that the Al film may be a pure Al film or an Al alloy film predominantly composed of Al. The Al alloy film predominantly composed of Al is a film in which the content percentage of Al is the highest compared with other elements. In this example, the ohmic conductive film 5b is an Al-3 mol % Ni film with 3 mol % nickel (Ni) added to Al is used as the ohmic conductive film 5b. The Al-3 mol % Ni film is deposited with a thickness of 20 nm by sputtering using known Ar gas. The light-reflecting ohmic conductive film 5b can be thereby formed. The structure in which the gate insulating film 4, the light-transmitting semiconductor film light-transmitting semiconductor film 5a and the ohmic conductive film 5b are laminated is thereby produced as shown in FIG. 5A. (FIG. 5B)

Next, a photoresist pattern 13 is formed by the second photolithography process. A novolac resin type positive photoresist is used in this example. The photoresist is applied with a thickness of about 1.6 μm by a slit coater or a spin coater. After that, exposure is performed using a photomask. Further, development is performed using an organic alkaline developer containing tetramethylammonium hydroxide (TMAH). The photoresist pattern 13 can be thereby formed on the ohmic conductive film 5b as shown in FIG. 5B. The photoresist pattern 13 is formed in an island shape and disposed in a region to become the TFT. Thus, the photoresist pattern 13 remains in the region to leave the pattern of the semiconductor layer 5 (FIG. 5B).

At the same time, the ohmic conductive film 5b is etched away by the same developer using the photoresist pattern 13 as a mask. Thus, development of the photoresist pattern 13 and etching of the ohmic conductive film 5b are performed in the same step. In the case of using an alkaline solution with TMAH 2.4% mass concentration as the developer at room temperature (23° C.), for example, the Al-3 mol % Ni film is etched at a rate of about 0.5 nm/s. Therefore, after development of the photoresist, the developing time is extended for 40 seconds or more. The Al-3 mol % Ni film with a thickness of 20 nm can be thereby etched away completely. In this manner, by using the developer of the photoresist pattern 13 also as an etchant of the ohmic conductive film 5b, the manufacturing process can be simplified.

As disclosed in Japanese Unexamined Patent Application Publication No. 2008-72011, the oxide semiconductor film such as the IGZO film used in this exemplary embodiment is highly soluble in an acid solution. Therefore, selective etching of the oxide semiconductor film and the metal thin film is not possible. It is thus known that patterning is very difficult. However, the light-transmitting semiconductor film light-transmitting semiconductor film 5a does not solve in an alkaline solution such as TMAH. Thus, by using an alkaline solution, it is possible to etch away only the ohmic conductive film 5b in the upper layer without etching the light-transmitting semiconductor film light-transmitting semiconductor film 5a. The patterning accuracy can be thus improved.

Further, in the case where a light-transmitting oxide film such as the IGZO film is laminated with or brought into contact with an Al metal, a cell reaction involving those films as electrodes can occur in an alkaline developer at the time of photoresist patterning. This causes oxidation corrosion of the Al metal and reductive corrosion of the IGZO film, leading to the occurrence of a pattern failure. However, in this exemplary embodiment, the Al-3 mol % Ni film prepared by adding Al to Ni is used. By etching away the Al-3 mol % Ni film in an alkaline developer, the cell reaction which has been an issue with the Al metal used hitherto can be prevented. This enables suitable selective etching without the reductive corrosion of the IGZO film.

It should be noted that, although the Al-3 mol % Ni film is used as the ohmic conductive film 5b in this exemplary embodiment, a material of the ohmic conductive film 5b is not limited thereto. For example, an element to be added to Al is not limited to Ni, and it may be palladium (Pd) or platinum (Pt), both in Group 10 of the periodic table. Further, two or more of Ni, Pd and Pt may be added to Al. By adding such elements to Al, etching can be performed without causing corrosion of the IGZO film in an alkaline solution (developer) containing TMAH. Further, the addition quantity is also not limited to 3 mol %, and etching can be performed by an alkaline developer containing TMAH as long as 0.5 mol % or more is added. When the addition quantity exceeds 10 mol %, the rate of precipitation of a compound phase of AlNi, AlPd and AlPt in the Al alloy film increases. It can become an etching residue in the alkaline developer to give rise to an etching defect. Thus, the total addition quantity of Ni, Pd and Pt to be added to Al is suitably between 0.5 mol % and 10 mol %. It is thereby possible to improve the etching rate by the organic alkaline developer, allowing easier etching.

Further, the TMAH concentration of the TMAH solution is not limited to 2.4 mass %, and it may be in the range of 0.2 mass % to 25 mass % at a solution temperature of 10° C. to 50° C., for example. This is because, when the TMAH concentration is less than 0.2 mass %, the etching rate of the Al alloy film significantly decreases, making etching difficult. On the other hand, when the TMAH concentration is more than 25 mass %, a damage to the photoresist pattern 13 increases, leading to a pattern failure.

Figure 5C:
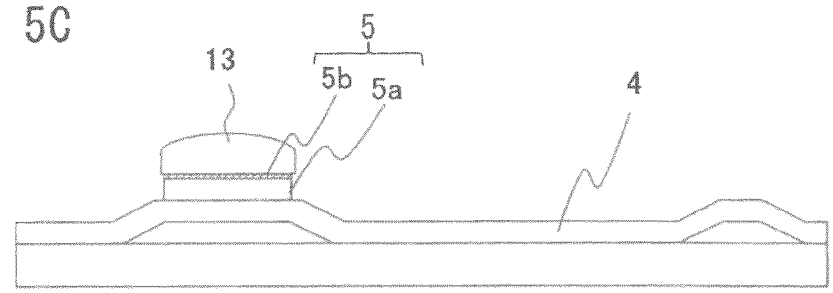

Besides, an N-atom or O-atom may be further added. The addition of an N-atom or O-atom may be performed by reactive sputtering. For example, the reactive sputtering is performed using a mixed gas prepared by adding $N_2$ gas or $O_2$ gas to Ar gas. An N-atom or O-atom can be thereby added to the Al alloy film. By using an alloy film further containing an N-atom or O-atom in addition to the Al alloy film, electrical ohmic contact characteristics can be made better. Specifically, the contact characteristics with the light-transmitting semiconductor film light-transmitting semiconductor film 5a in the lower layer and the contact characteristics with the source electrode 7 and the drain electrode 8 in the upper layer can be made better. This improves the TFT characteristics. Note that the addition quantity of an N-atom and an O-atom can be controlled by adjusting the partial pressure ratio of $N_2$ gas or $O_2$ gas. (FIG. 5C)

Figure 5D:
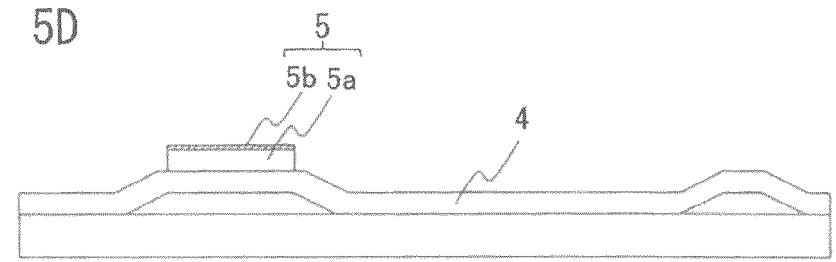

Then, the light-transmitting semiconductor film light-transmitting semiconductor film 5a is etched away using the photoresist pattern 13 as a mask. In this etching step, a solution with a 5 mass % concentration of oxalic acid is used. In this case, the IGZO film of the light-transmitting semiconductor film light-transmitting semiconductor film 5a is etched away at a rate of about 1 nm/s at room temperature (23° C.). As shown in FIG. 5C, the light-transmitting semiconductor film light-transmitting semiconductor film 5a is patterned, and the island-shaped semiconductor layer 5 can be formed. The light-reflecting ohmic conductive film 5b made of Al-3 mol % Ni does not solve in a known common oxalic acid solution, not limited to the oxalic acid solution in this exemplary embodiment. Therefore, only the light-transmitting semiconductor film light-transmitting semiconductor film 5a can be selectively etched. The patterning accuracy can be thus improved. (FIG. 5D)

After that, the photoresist pattern 13 is peeled off using an amine peeling liquid. The semiconductor pattern of the light-transmitting semiconductor film light-transmitting semiconductor film 5a and the light-reflecting ohmic conductive film 5b is thereby formed as shown in FIG. 5D. Note that FIG. 5D shows the same structure as that shown in FIG. 4B. The patterns of the light-transmitting semiconductor film light-transmitting semiconductor film 5a and the ohmic conductive film 5b are substantially identical. In other words, the pattern of the ohmic conductive film 5b is formed not protruding from the pattern of the light-transmitting semiconductor film light-transmitting semiconductor film 5a.

In this step, the quality of the pattern may be checked. An example of the quality check of the pattern is described hereinbelow. The quality check the finished pattern is typically performed by detecting a failure part using a pattern defect inspection device. For example, the pattern defect inspection device includes a lighting unit that applies illumination light to the pattern and an imaging unit that detects reflected light from the pattern. The lighting unit applies illumination light to the pattern formed on the substrate 1 by using a light source such as a halogen lamp, LED or metal halide lamp. When the illumination light is applied to the pattern formed on the substrate, it is reflected according to the pattern. The imaging unit captures the reflected light from the pattern and picks up the image. The imaging unit includes an optical system such as a CCD camera and a lens for detecting the reflected light. The image of the pattern formed on the substrate 1 can be thereby picked up. The image is represented as 256 gradation luminance data, for example, with respect to each pixel. Then, the pattern defect inspection device performs image processing on the image and thereby detects a failure part.

In the image processing which detects a failure part from the picked-up image, pattern matching is typically used. In the pattern matching, the pixel luminance (e.g. 256 gradations) in the repetitive periodic portion is compared. There are at least three portions of the pixel luminance (256 gradations) to be compared, two with no failure defect and one with a failure defect. When there is a larger difference in luminance in the pixel luminance (256 gradations) of the portion with a failure defect than in the pixel luminance (256 gradations) of the portion with no failure defect, it is detected as a failure defect. Then, only non-defective items are passed to the next step. Alternatively, items are passed to the next step after the defect is corrected. By the defect inspection, the yield can be improved, leading to better productivity.

However, in the case where the semiconductor pattern is made only of a material with high transmittance such as the oxide semiconductor film used hitherto, the illumination light passes through the semiconductor pattern. Consequently, the intensity of the reflected light received by the CCD camera is reduced. Accordingly, even when a pattern failure defect exists, a difference in luminance from a normal portion with no failure defect is small. This raises an issue that the defect detection sensitivity decreases. On the other hand, in the exemplary embodiment of the invention, the light-reflecting ohmic conductive film 5b is placed in the upper layer of the light-transmitting semiconductor film light-transmitting semiconductor film 5a. Further, the pattern of the semiconductor layer 5 is formed at a time. The light-reflecting pattern of the same shape is thereby present on the surface of the light-transmitting semiconductor film light-transmitting semiconductor film 5a. The illumination light is thus reflected by the ohmic conductive film 5b, allowing the highly sensitive pattern defect inspection of the light-transmitting semiconductor film light-transmitting semiconductor film 5a in the lower layer. For example, supposing that the luminance on the substrate is about 20 to 100 gradations, the luminance on a common light-reflecting metal film is about 150 to 256 gradations. Accordingly, a difference between the luminance on the glass substrate and the luminance on the metal film is large. By forming the ohmic conductive film 5b into the same pattern shape as the light-transmitting semiconductor film light-transmitting semiconductor film 5a, more reliable inspection can be accomplished. Defective items having a defect in the pattern of the semiconductor layer 5 can be thereby eliminated. Eliminating defective items in this stage allows improvement of productivity. The above-described number of gradations is a typical example, and it varies depending on the intensity of illumination light and other conditions.

(FIG. 4C)

Figure 4C:
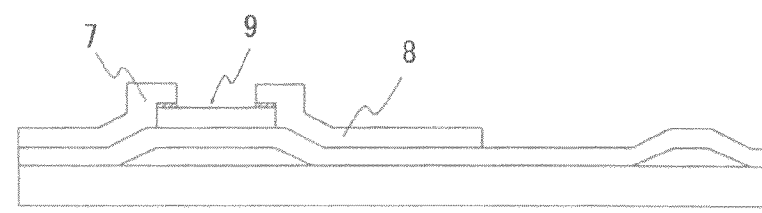

Referring back to FIG. 4C, a second metal film is deposited, and the source lines 27, the source electrode 7, the drain electrode 8 and the like are formed. Further, the ohmic conductive film 5b is removed between the patterns of the source electrode 7 and the drain electrode 8 disposed opposite to each other. The channel part 9 of the TFT 108 is formed in the area between the patterns of the source electrode 7 and the drain electrode 8. The structure shown in FIG. 4C is thereby produced.

As the second metal film, Cr, Mo, Ti, Ta, W, Al, or an alloy with another trace element added to these metals may be used, for example. Further, the second metal film may have a laminated structure composed of two or more layers of those metals or alloy. By using such metals or alloy, a low-resistance film with a specific resistance of 50 $\mu\Omega$m or less can be obtained.

In this exemplary embodiment, a Mo film is used as the second metal film. The Mo film with a thickness of 200 nm is deposited by sputtering using known Ar gas. After that, a photoresist pattern is formed by the third photolithography process, and the Mo film is patterned. Specifically, the Mo film is etched using the photoresist pattern as a mask. In this example, the Mo film and the ohmic conductive film 5b in the channel part 9 are wet-etched in succession. Note that, in this etching, a known chemical solution containing phosphoric acid, nitric acid and acetic acid may be used as an etchant. The photoresist pattern is then removed. The source electrode 7, the drain electrode 8, the channel part 9 of the TFT 108 and the like can be thereby formed as shown in FIG. 4C.

Note that, although the second metal film and the ohmic conductive film 5b are formed by etching using the same chemical solution in this exemplary embodiment, those films may be etched away using different chemical solutions. For example, the chemical solution containing phosphoric acid, nitric acid and acetic acid may be used for the etching of the second metal film, and the above-described TMAH may be used for the etching of the ohmic conductive film 5b.

Figure 4D:
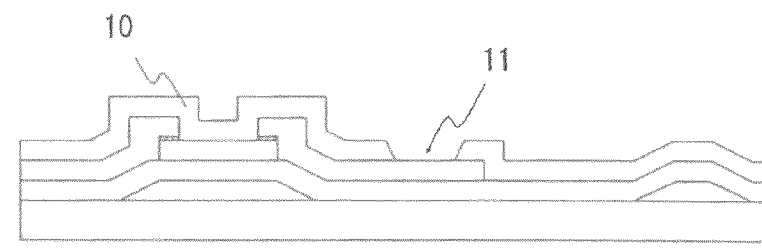

Further, after removing the ohmic conductive film 5b in the channel part 9, the surface of the channel part 9 may be cleaned by an alkaline solution containing TMAH. Alternatively, plasma exposure (plasma processing) may be performed on the surface of the channel part 9. In the plasma processing, plasma such as helium (He), hydrogen (H), neon (Ne), argon (Ar), nitrogen ($N_2$), or gas containing fluorine such as $SF_6$, $CF_4$, $F_2$, HF, $NF_3$, $CHF_3$ or $C_2F_6$ may be used. By performing the plasma processing with such gas, a foreign substance and contamination on the surface of the channel part 9 can be removed. Better off-characteristics of the TFT (lower off-current) can be thereby obtained. Further, oxygen ($O_2$) gas plasma processing may be performed. In this case, it is possible to remove a foreign substance and contamination on the surface of the channel part 9 and further supply oxygen atoms to the surface of the light-transmitting semiconductor film light-transmitting semiconductor film 5a in channel part 9. This increases the resistance near the surface, thereby achieving still better off-characteristics of the TFT. Note that the oxygen ($O_2$) gas plasma processing may be performed additionally after performing the plasma processing and thereby removing a foreign substance and contamination on the surface of the channel part 9.
(FIG. 4D)

Figure 4E:
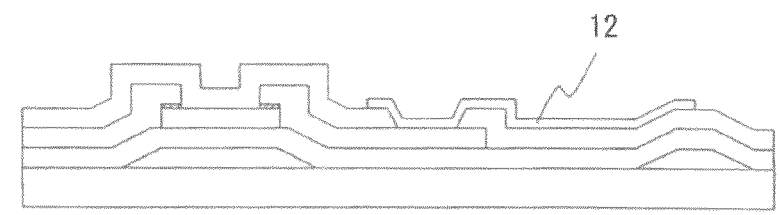

Then, the protective insulating film 10 is deposited. In this exemplary embodiment, the protective insulating film 10 is deposited using chemical vapor deposition (CVD). Specifically, a silicon nitride (SiN) film with a thickness of 300 nm is deposited under the substrate heating condition of about 250° C. After that, a photoresist pattern is formed by the fourth photolithography process, and the SiN film is patterned. Specifically, the SiN film is etched using the photoresist pattern as a mask. In this etching, dry etching using known fluorine gas may be used. The contact hole 11 can be thereby made above the drain electrode 8. After that, the photoresist pattern is removed, and the protective insulating film 10 having the contact hole 11 can be thereby formed as shown in FIG. 4D.
(FIG. 4E)

Finally, a transparent conductive film is deposited, and the pattern of the pixel electrode 12 is formed. In this exemplary embodiment, IZO (indium oxide ($In_2O_3$)+zinc oxide (ZnO)) is used as the transparent conductive film. Then, an IZO film with a thickness of 100 nm is deposited by sputtering using known Ar gas. Then, a photoresist pattern is formed by the fifth photolithography process, and the pixel electrode 12 is patterned. Specifically, the IZO film is etched using the photoresist pattern as a mask. The pixel electrode 12 is thereby formed. In this etching, wet etching by a known oxalic acid solution may be used. Then, the photoresist pattern is removed after the etching. The structure shown in FIG. 4E is thereby produced, and the TFT substrate is completed.

On the surface of the TFT substrate which is completed by performing the photolithography process five times, an alignment film and spacers are formed. The alignment film is made of polyimide or the like for aligning liquid crystals. Further, a counter substrate provided with a color filter and an alignment film is prepared. The TFT substrate and the counter substrate are attached to each other. Then, liquid crystals are injected and sealed in the gap created between the substrates by the spacers. Further, a polarizing plate, a phase difference plate, a backlight unit and the like are provided on the outer sides of the both substrates. A liquid crystal display can be thereby completed (not shown).

In this exemplary embodiment, the ohmic conductive film 5b is interposed between the source electrode 7, the drain electrode 8 and the light-transmitting semiconductor film light-transmitting semiconductor film 5a. The ohmic conductive film 5b has a lower light transmittance than the light-transmitting semiconductor film light-transmitting semiconductor film 5a. Note that the ohmic conductive film 5b may be a reflection film that reflects light as long as it has a lower light reflectance than the light-transmitting semiconductor film light-transmitting semiconductor film 5a, and it may be a low reflection film that transmits a part of light. The low reflection film may have a reflectance of 50% or less for light with a wavelength of 550 nm, for example. Specifically, a Si film to which an impurity such as phosphorus (P) is added may be used as the low reflection film.

In the case of using the light-transmitting semiconductor film light-transmitting semiconductor film 5a also, it is possible to easily detect a pattern failure in the pattern shape inspection of the semiconductor layer 5. Specifically, when applying illumination light by the pattern defect inspection device, the illumination light is reflected by the ohmic conductive film 5b. Accordingly, the amount of reflected light received by the imaging unit increases. The ohmic conductive film 5b has the same pattern shape as the light-transmitting semiconductor film light-transmitting semiconductor film 5a. The detection sensitivity of a pattern defect of the semiconductor layer 5 can be thereby enhanced. It is thereby possible to effectively reduce the occurrence of a manufacturing failure of the TFT 108.

A material having a low resistance to an acid chemical solution is used for the light-transmitting semiconductor film light-transmitting semiconductor film 5a. Further, the source electrode 7 and the drain electrode 8 are made of a metal film which is typically etched by an acid chemical solution. At the time of patterning, the etching selectivity of those can be achieved. Specifically, at the patterning of the source electrode 7 and the drain electrode 8, the etching selectivity with the light-transmitting semiconductor film light-transmitting semiconductor film 5a increases. The patterning accuracy can be thereby improved. Further, this eliminates the need for selecting the type of the metal film, the etching solution of the metal film, and the oxide semiconductor film for manufacture as in Japanese Unexamined Patent Application Publication No. 2008-72011. The range of choice of materials such as a film type and an etching solution can be thereby broadened.

Particularly, the TFT substrate using an oxide semiconductor film with a high mobility can be achieved. Therefore, a TFT active matrix substrate with a high operating speed and a display device using the same can be manufactured with a high yield. It is thus possible to manufacture a high-performance TFT substrate and liquid crystal display with high productivity. The TFT substrate may be used for a display device other than a liquid crystal display as a matter of course. For example, the TFT substrate may be used for an electro-optical device such as an organic electroluminescence display. Further, application to a thin film transistor and an active matrix substrate used for a semiconductor component or the like other than a display device is also possible.

Second Exemplary Embodiment

In this exemplary embodiment, a material of the ohmic conductive film 5b is different. Although the ohmic conductive film 5b is an Al alloy film in the first exemplary embodiment, the ohmic conductive film 5b is a pure Cu film or a Cu alloy film predominantly composed of Cu. Hereinafter, a pure Cu film or a Cu alloy film predominantly composed of Cu is referred to as a Cu film. Note that the other structure and the like are the same as that of the first exemplary embodiment and thus not redundantly described below.

Figure 7A:
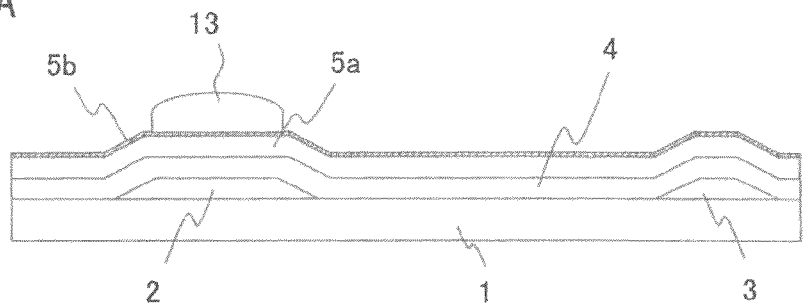
FIGS. 7A to 7D are views showing the behavior of photo-carriers in a TFT substrate according to an exemplary embodiment.

A manufacturing process of a TFT according to the exemplary embodiment is described hereinafter with reference to FIGS. 7A to 7D. FIGS. 7A to 7D are step-by-step cross-sectional views showing a manufacturing process of the TFT according to the exemplary embodiment, and the manufacturing step corresponding to FIG. 4B according to the first exemplary embodiment is shown in detail.
(FIG. 7A)

First, a silicon nitride (SiN) film to serve as the gate insulating film 4 is formed using chemical vapor deposition (CVD). In this example, a silicon nitride (SiN) film with a thickness of 300 nm is deposited under the substrate heating condition of about 300° C. The gate electrode 2 and the auxiliary capacitor electrodes 3 are thereby covered with the gate insulating film 4. After that, the light-transmitting semiconductor film light-transmitting semiconductor film 5a and the ohmic conductive film 5b are deposited in succession.

Specifically, the light-transmitting semiconductor film light-transmitting semiconductor film 5a is deposited by sputtering. In the sputtering of the light-transmitting semiconductor film light-transmitting semiconductor film 5a, an oxide target having an amorphous structure with an atomic composition ratio of In:Ga:Zn:O=1:1:1:4 (hereinafter referred to as IGZO) is used. The IGZO film with a thickness of 50 nm is deposited by reactive sputtering using a mixed gas prepared by adding $O_2$ gas to Ar gas. In this example, a mixed gas in which $O_2$ gas with a partial pressure ratio of 10% is added to Ar gas is used.

Subsequently, a Cu film is deposited by sputtering as the ohmic conductive film 5b. In this sputtering, a pure Cu film with a thickness of 20 nm is deposited using pure Ar gas. Next, a photoresist pattern 13 is formed by the second photolithography process. The structure shown in FIG. 7A is thereby produced.

(FIG. 7B)

Figure 7B:
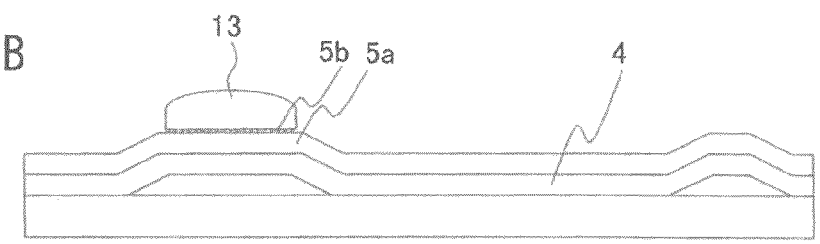

Next, the ohmic conductive film 5b is etched away using the photoresist pattern 13 as a mask. The pattern of the ohmic conductive film 5b is thereby formed as shown in FIG. 7B. In this etching, a chemical solution containing an aqueous solution with 0.3 mass % ammonium persulfate at a solution temperature of 23° C. is used as an etchant. In this case, the ohmic conductive film 5b made of a pure Cu film is etched at a rate of about 1 nm/s. As disclosed in Japanese Unexamined Patent Application Publication No. 2008-72011, the light-transmitting semiconductor film light-transmitting semiconductor film 5a such as the IGZO film used in this exemplary embodiment is highly soluble in an acid solution. Therefore, selective etching of the light-transmitting semiconductor film light-transmitting semiconductor film 5a and the metal thin film is not possible. It is thus known that patterning is very difficult. However, the light-transmitting semiconductor film light-transmitting semiconductor film 5a is not easily etched by an ammonium persulfate solution. By using a chemical solution containing ammonium persulfate, only the ohmic conductive film 5b made of Cu can be selectively etched.

(FIG. 7C)

Figure 7C:
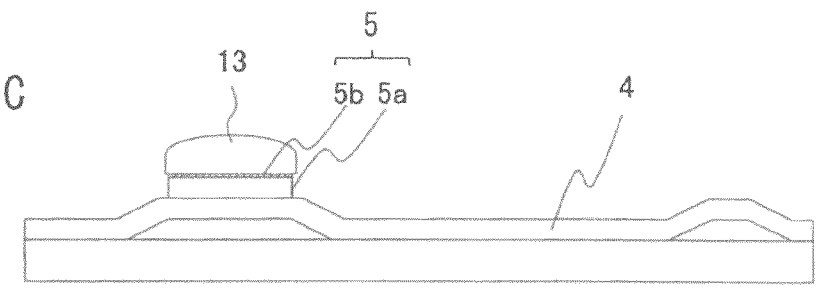

Then, the light-transmitting semiconductor film light-transmitting semiconductor film 5a is etched away using the photoresist pattern 13 as a mask. In this example, an oxalic acid solution is used as an etchant. The light-transmitting semiconductor film light-transmitting semiconductor film 5a is patterned, and the island-shaped semiconductor layer 5 is formed as shown in FIG. 7C. The ohmic conductive film 5b made of light-reflecting Cu does not solve in the oxalic acid solution. Therefore, only the light-transmitting semiconductor film light-transmitting semiconductor film 5a can be selectively etched. The patterning accuracy can be thereby improved, and the pattern of the light-transmitting semiconductor film light-transmitting semiconductor film 5a and the pattern of the ohmic conductive film 5b placed thereabove are substantially identical.

(FIG. 7D)

Figure 7D:
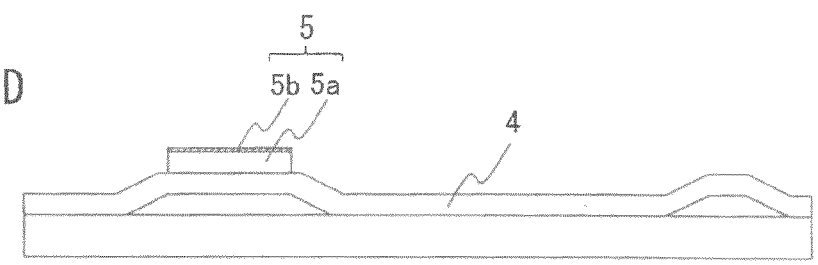

After that, the photoresist pattern 13 is peeled off using an amine peeling liquid. The structure shown in FIG. 7D is thereby produced. The structure shown in FIG. 7D is the same as that of FIG. 4B or FIG. 5D. The semiconductor layer 5 composed of the light-transmitting semiconductor film light-transmitting semiconductor film 5a and the ohmic conductive film 5b is formed in an island shape.

After that, the same process as shown in FIGS. 4C to 4E in the first exemplary embodiment is performed, and thereby the TFT substrate according to the second exemplary embodiment can be completed. Further, the second metal film to become the source electrode 7 and the drain electrode 8, and the ohmic conductive film 5b may be etched by different etching solutions. For example, when the second metal film is the Mo film, which is the same as in the first exemplary embodiment, the chemical solution containing phosphoric acid, nitric acid and acetic acid may be used for the etching of the second metal film, and the above-described ammonium persulfate solution may be used for the etching of the ohmic conductive film 5b. A foreign substance and contamination on the surface of the channel part 9 can be thereby removed, thus improving the TFT characteristics. Further, the channel part 9 may be cleaned by plasma processing or the like as in the first exemplary embodiment.

Then, the same process as in the first exemplary embodiment is performed, and thereby a liquid crystal display can be completed. In this exemplary embodiment, the same advantages as those of the first exemplary embodiment can be obtained. Although not described above, an optical pattern defect inspection may be performed as appropriate.

Although a pure Cu film is used as the light-reflecting ohmic conductive film 5b in the above description, it is not limited thereto. For example, a Cu alloy to which an N-atom or O-atom is added may be used as the ohmic conductive film 5b. Specifically, reactive sputtering using a mixed gas prepared by adding $N_2$ gas or $O_2$ gas to Ar gas is used. Alternatively, a Cu alloy to which an N-atom or O-atom is added may be deposited by the reactive sputtering. By using a Cu alloy film containing an N-atom or O-atom, etching by the ammonium persulfate solution can be further facilitated. This further improves electrical ohmic contact characteristics with the light-transmitting semiconductor film light-transmitting semiconductor film 5a in the lower layer and the source electrode 7 and the drain electrode 8 in the upper layer. As a matter of course, both of an N-atom and O-atom may be added to Cu, and an atom different from an N-atom and O-atom may be further added.

Further, the ammonium persulfate concentration of the ammonium persulfate solution is not limited to 0.3 mass %, and it may be in the range of 0.02 mass % to 10 mass % at a solution temperature of 10° C. to 50° C., for example. When the ammonium persulfate concentration is less than 0.02 mass %, the etching rate of the above-described Cu alloy film significantly decreases, making etching difficult. On the other hand, when the ammonium persulfate concentration is more than 10 mass %, the side etching amount of the Cu alloy film (the recessed amount from the end of the resist pattern 13 to the end of the Cu alloy film pattern 5b) increases. Consequently, in the plane pattern, the pattern shape of the Cu alloy film 5b is largely recessed inside the pattern shape of the light-transmitting semiconductor film light-transmitting semiconductor film 5a. This makes it difficult to accurately inspect a pattern defect of the semiconductor layer 5.

Note that, although the case where an oxide semiconductor (IGZO) composed of indium oxide, gallium oxide and zinc oxide is applied as the light-transmitting semiconductor film 5a is described in the first and second exemplary embodiments, the material is not limited thereto. For example, a nitride semiconductor made of nitrogen compound predominantly composed of a Group 13 element or a semiconductor made of a mixture of such oxide and nitride may be applied. In the case of using such materials also, the same advantages can be obtained. Thus, a semiconductor film containing at least one of an N-atom and an O-atom and having a translucency may be used. In this manner, by using the non-silicone light-transmitting semiconductor film 5a, a high-performance TFT can be obtained. Note that, in this specification, the predominant component is defined as a component with the highest proportion among two or more kinds of components constituting a substance.

Figure 8:
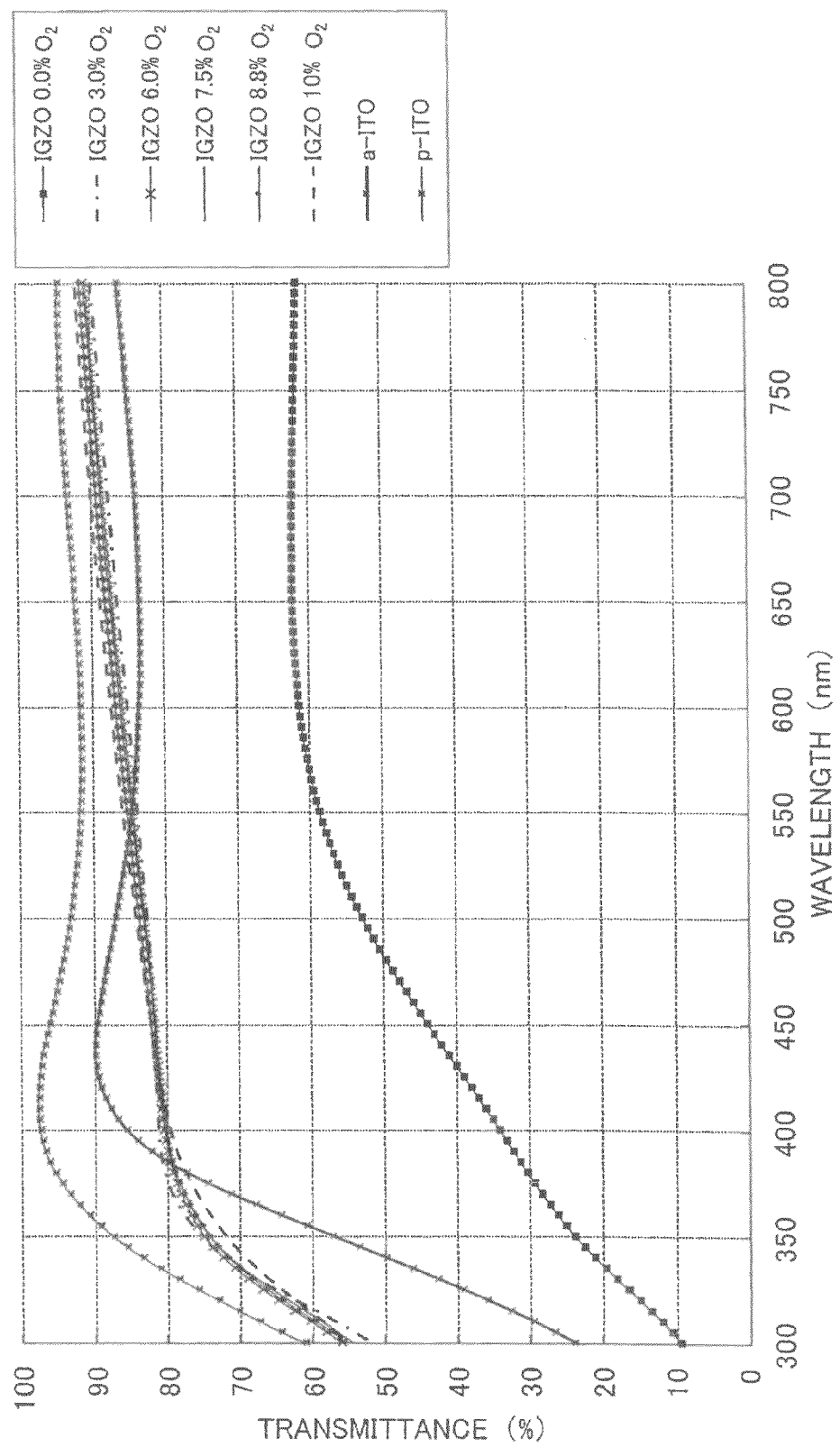
FIG. 8 is a view showing transmittance characteristics of a light-transmitting semiconductor film light-transmitting semiconductor film.
Figure 9:
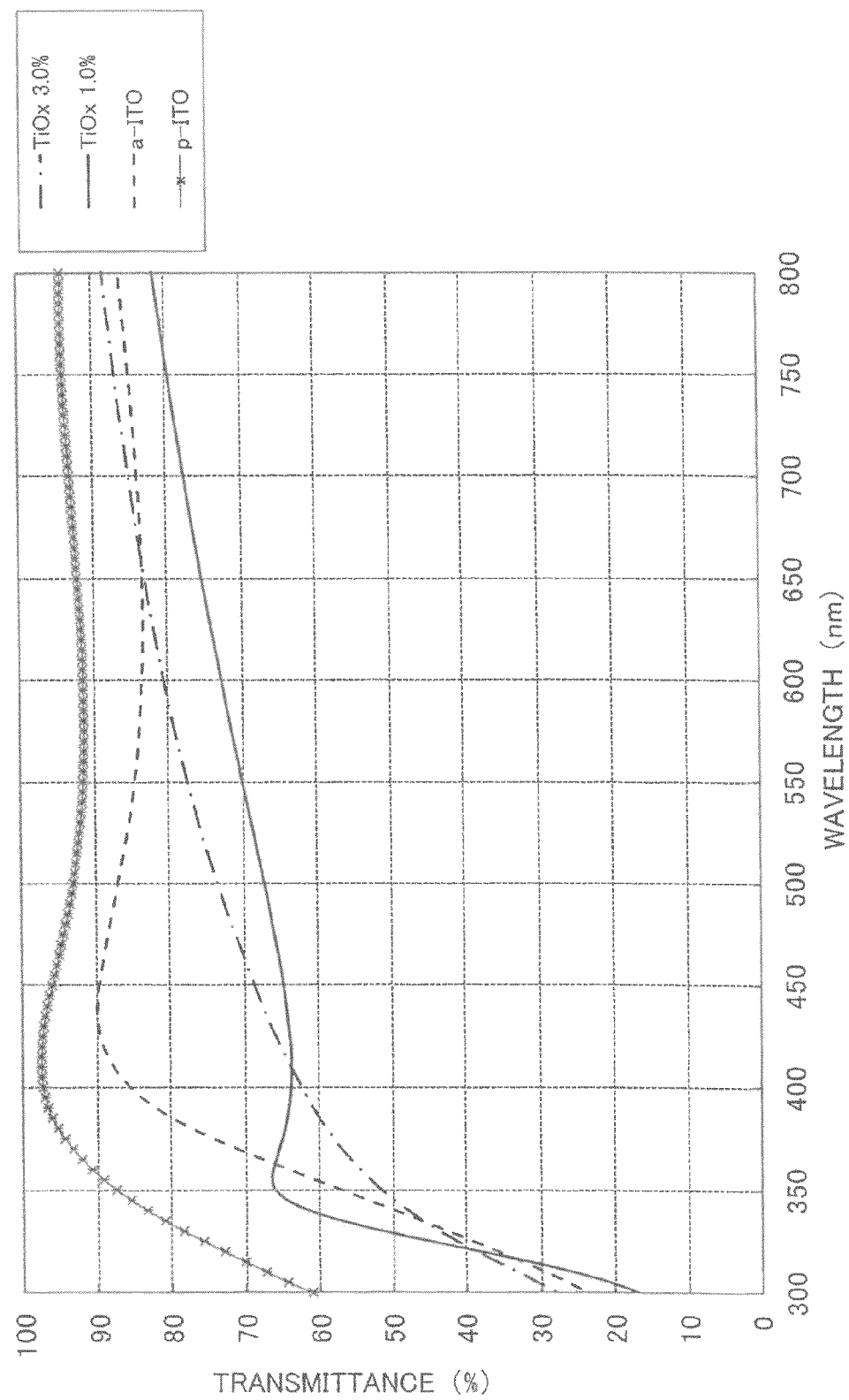
FIG. 9 is a view showing transmittance characteristics of a light-transmitting semiconductor film light-transmitting semiconductor film.
Figure 10:
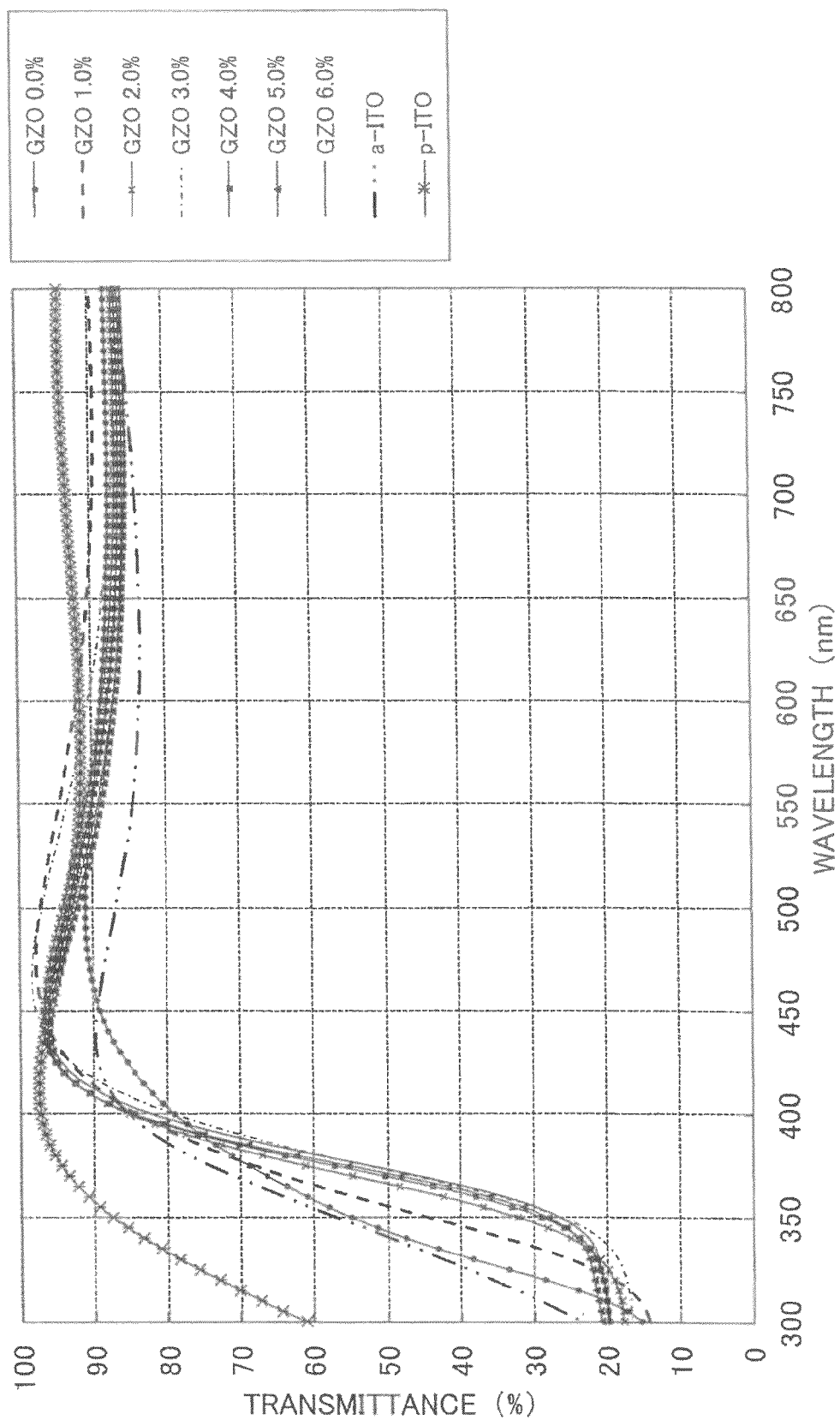
FIG. 10 is a view showing transmittance characteristics of a light-transmitting semiconductor film light-transmitting semiconductor film.

The transmittance of the light-transmitting semiconductor film 5a is described with reference to FIGS. 8 to 10. FIGS. 8 to 10 are graphs showing the transmittance spectral characteristics of the light-transmitting semiconductor film 5a. FIG. 8 is a graph showing the transmittance characteristics of an IGZO film with a thickness of 50 nm. FIG. 9 is a graph showing the transmittance characteristics of a TiOx film with a thickness of 50 nm. FIG. 10 is a graph showing the transmittance characteristics of a GZO film with a thickness of 50 nm. In this example, the transmittance is measured with various addition quantities of oxygen. In FIGS. 8 to 10, the horizontal axis indicates a light wavelength, and the vertical axis indicates a transmittance (as. depo). In FIGS. 8 to 10, an amorphous ITO (a-TIO) and a polycrystalline ITO (p-ITO) are also shown as a comparative example. In each film type, the transmittance for a wavelength 550 nm is 50% or more.

Even in the case of using the light-transmitting semiconductor film 5a with a high transmittance, pattern defect inspection can be reliably performed by forming the ohmic conductive film 5b. Note that, by performing the pattern defect inspection immediately after forming the semiconductor layer 5, a defect can be detected effectively. For example, optical defect inspection is performed in the state shown in FIG. 5D or FIG. 7D. It is thereby possible to effectively detect a defect. As a matter of course, pattern defect inspection may be performed at any timing after forming the semiconductor layer 5.

In the first and second exemplary embodiments, patterning is performed after depositing the light-transmitting semiconductor film 5a and the ohmic conductive film 5b in succession. Thus, the light-transmitting semiconductor film 5a and the photoresist used for the patterning with the ohmic conductive film 5b are common. Accordingly, the pattern end of the ohmic conductive film 5b in the upper layer substantially coincides with the pattern end of the light-transmitting semiconductor film 5a. The ohmic conductive film 5b is formed not to protrude from the light-transmitting semiconductor film 5a. This allows simplification of the manufacturing process. Specifically, a photolithography step can be eliminated compared with the case where patterning is performed using different photoresist patterns. This enables reliable inspection of the semiconductor layer 5. The productivity can be thereby improved.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A thin film transistor comprising:
a gate electrode;
a semiconductor layer disposed opposite to the gate electrode with a gate insulating film interposed therebetween;
a source electrode placed above the semiconductor layer and electrically connected with the semiconductor layer; and
a drain electrode placed above the semiconductor layer and electrically connected with the semiconductor layer, wherein
the semiconductor layer includes a light-transmitting semiconductor film and a conductive film placed on the light-transmitting semiconductor film and having a lower light transmittance than the light-transmitting semiconductor film,
the conductive film is formed not to protrude from the light-transmitting semiconductor film,
the conductive film is formed in separate parts with a channel part interposed between the source electrode and the drain electrode,
the source electrode and the drain electrode are connected to the light-transmitting semiconductor film through the conductive film,
the conductive film is made of aluminum or an alloy film predominantly composed of aluminum.

2. The thin film transistor according to claim 1, wherein the light-transmitting semiconductor film contains at least one of indium oxide, gallium oxide, zinc oxide, and nitrogen compound predominantly composed of a Group 13 element.

3. The thin film transistor according to claim 1, wherein the alloy film predominantly composed of aluminum contains at least one of nickel, palladium and platinum as an additive.

4. The thin film transistor according to claim 1, wherein the alloy film predominantly composed of aluminum contains at least one of nitrogen and oxygen as an additive.

5. An active matrix substrate comprising:
thin film transistors according to claim 1 arranged in a matrix; and
a pixel electrode connected to the drain electrode of the thin film transistors.

6. The thin film transistor according to claim 1, wherein the conductive film is made of pure aluminum or an alloy film predominantly composed of aluminum.

7. The thin film transistor according to claim 6, wherein the alloy film predominantly composed of aluminum contains at least one of nickel, palladium and platinum as an additive.

8. The thin film transistor according to claim 6, wherein the alloy film predominantly composed of aluminum contains at least one of nitrogen and oxygen as an additive.

9. The thin film transistor according to claim 1, wherein the conductive film is a light reflection film.

10. The thin film transistor according to claim 1, wherein the light-transmittance semiconductor film includes a material other than a material of the conductive film.

11. The thin film transistor according to claim 1, wherein the conductive film is made of pure aluminum.

12. A thin film transistor comprising:
a gate electrode;
a semiconductor layer disposed opposite to the gate electrode with a gate insulating film interposed therebetween;
a source electrode placed above the semiconductor layer and electrically connected with the semiconductor layer; and
a drain electrode placed above the semiconductor layer and electrically connected with the semiconductor layer, wherein
the semiconductor layer includes a light-transmitting semiconductor film and a conductive film placed on the light-transmitting semiconductor film and having a lower light transmittance than the light-transmitting semiconductor film,
the conductive film is formed not to protrude from the light-transmitting semiconductor film,
the conductive film is formed in separate parts with a channel part interposed between the source electrode and the drain electrode, the source electrode and the drain electrode are connected to the light-transmitting semiconductor film through the conductive film, and the conductive film is made of copper or an alloy film predominantly composed of copper.

13. The thin film transistor according to claim 12, wherein the alloy film predominantly composed of copper contains at least one of nitrogen and oxygen as an additive.

* * * * *